US012720871B2

(12) United States Patent
Mysore Rajagopal et al.

(10) Patent No.: US 12,720,871 B2

(45) Date of Patent: Aug. 25, 2026

(54) SEMICONDUCTOR PROTECTION DEVICES WITH HIGH AREA EFFICIENCY

(71) Applicant: Texas Instruments Incorporated, Dallas, TX (US)

(72) Inventors: Krishna Praveen Mysore Rajagopal, Manteca, CA (US); James Di Sarro, Allen, TX (US); Yang Xiu, Richardson, TX (US); Ann Concannon, Palo Alto, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 394 days.

(21) Appl. No.: 18/068,611

(22) Filed: Dec. 20, 2022

(65) Prior Publication Data

US 2023/0238378 A1 Jul. 27, 2023

Related U.S. Application Data

(60) Provisional application No. 63/302,409, filed on Jan. 24, 2022.

(51) Int. Cl.
*H10D 89/60* (2025.01)

(52) U.S. Cl.
CPC ......... *H10D 89/611* (2025.01); *H10D 89/931* (2025.01)

(58) Field of Classification Search
CPC ........................ H01L 27/0296; H01L 27/0255
USPC .......................................................... 257/173
See application file for complete search history.

(56) References Cited

U.S. PATENT DOCUMENTS

| | | | | |
|---|---|---|---|---|
| 6,770,918 B2 * | 8/2004 | Russ | H10D 8/00 | 257/361 |
| 2004/0033666 A1 * | 2/2004 | Williams | H01L 21/743 | 438/297 |
| 2005/0151160 A1 * | 7/2005 | Salcedo | H10D 89/713 | 257/362 |
| 2006/0033155 A1 * | 2/2006 | Wu | H01L 21/74 | 257/E29.268 |
| 2008/0253045 A1 | 10/2008 | Sato et al. | | |
| 2012/0008242 A1 * | 1/2012 | Salcedo | H10D 89/711 | 257/E21.608 |
| 2012/0056668 A1 * | 3/2012 | Jordan | H03F 3/45475 | 327/566 |
| 2014/0332843 A1 * | 11/2014 | Clarke | H10D 89/60 | 257/121 |

(Continued)

*Primary Examiner* — Sheng-Bai Zhu

(74) *Attorney, Agent, or Firm* — Yudong Kim; Frank D. Cimino

(57) ABSTRACT

Semiconductor devices with high area efficiency are described. Such a semiconductor device can be positioned within an isolation structure, and include diodes coupled to the isolation structure. In this manner, the semiconductor devices utilize an area, which may be otherwise left as an inactive space (or dead space) to achieve a smaller footprint. Further, the semiconductor devices may include multiple fingers of doped regions arranged horizontally, vertically, or a combination of both. The fingers of doped regions form diodes connected in parallel using metal lines that are parallelized to facilitate flowing large amounts of current. The parallelized metal lines with reduced lengths ameliorate issues associated with parasitic resistance of the metal lines during ESD or surge events.

27 Claims, 7 Drawing Sheets

(56) References Cited

U.S. PATENT DOCUMENTS

2016/0079234 A1 3/2016 Kanai et al.
2016/0300830 A1* 10/2016 Salcedo ................. H10D 89/10

* cited by examiner

N1/H
N2/L
255
247
245
250
300
375c
370d
375d
370b
375b
301
370a
375a
370c
375f
370e
375e
360
246
365
240
235
230
D1
D2

N1/H
N2/L
D2
D1
D1
D2

SEMICONDUCTOR PROTECTION DEVICES WITH HIGH AREA EFFICIENCY

CROSS-REFERENCE TO RELATED APPLICATIONS

The present Application for Patent claims the benefit of U.S. Provisional Patent Application No. 63/302,409, entitled "Highly Integrated & Compact Anti-parallel Diodes for ESD Protection," filed Jan. 24, 2022, which is hereby incorporated by reference in its entirety herein.

TECHNICAL FIELD

The present disclosure generally relates to the field of semiconductor devices, and more particularly to semiconductor protection devices with high area efficiency.

BACKGROUND

Semiconductor chips or integrated circuits (ICs) typically include multiple functional blocks that are connected together, such as an input/output (I/O) block receiving and transmitting electrical signals, a signal processing block handling electrical signals, a controller block managing overall functional aspects of the ICs, or the like. The functional blocks of the ICs operate with their own power domains having different operational characteristics. As such, interfaces between the functional blocks are required to have certain attributes, for instance, isolating noise from one functional block to another, providing conductive current paths among the functional blocks during electrostatic discharge (ESD) or surge events, among others.

To that end, one or more semiconductor protection devices can be placed at the interfaces between the functional blocks. As typical ICs include multitudes of such protection devices, it would be desirable for the protection devices to be area efficient to avoid occupying significant areas of the ICs while handling desired levels of ESD or surge current. During normal operations of the ICs, the protection devices are inactive so as not to interfere with the normal operations. Although the protection devices are inactive (e.g., a diode under a reverse bias condition), their presence tends to increase parasitic capacitance for the ICs. As such, it would be also desirable for the protection devices to have small footprints to provide low capacitance to the ICs.

SUMMARY

The present disclosure describes semiconductor protection devices with high area efficiency. The protection devices may include two or more diodes connected in parallel and in an opposite direction. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a semiconductor device includes a first diode including a first pn junction across a p-doped region and a first n-well including the p-doped region, where the first n-well is coupled to a first terminal and the p-doped region is coupled to a second terminal; and a second diode including a second pn junction across a p-well and a second n-well adjacent to the p-well, where the p-well is coupled to the first terminal and the second n-well is coupled to the second terminal, and where the second n-well overlaps a third n-well of an isolation structure surrounding the semiconductor device.

In some embodiments, a semiconductor device includes a first diode including a first pn junction across an n-doped region and a p-well including the n-doped region, where the n-doped region is coupled to a first terminal and the p-well is coupled to a second terminal; and a second diode including a second pn junction across a p-doped region and an n-well including the p-doped region, where the p-doped region is coupled to the first terminal and the n-well is coupled to the second terminal, and where the n-well overlaps a deep n-well of an isolation structure surrounding the semiconductor device.

In some embodiments, a semiconductor device includes a p-well including an n-doped region, where a first diode is formed across the n-doped region and the p-well; and an n-well surrounding the p-well, the n-well including a p-doped region surrounding the p-well, where a second diode is formed across the p-doped region and the n-well, and where the n-well overlaps a deep n-well of an isolation structure that surrounds the semiconductor device.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1:
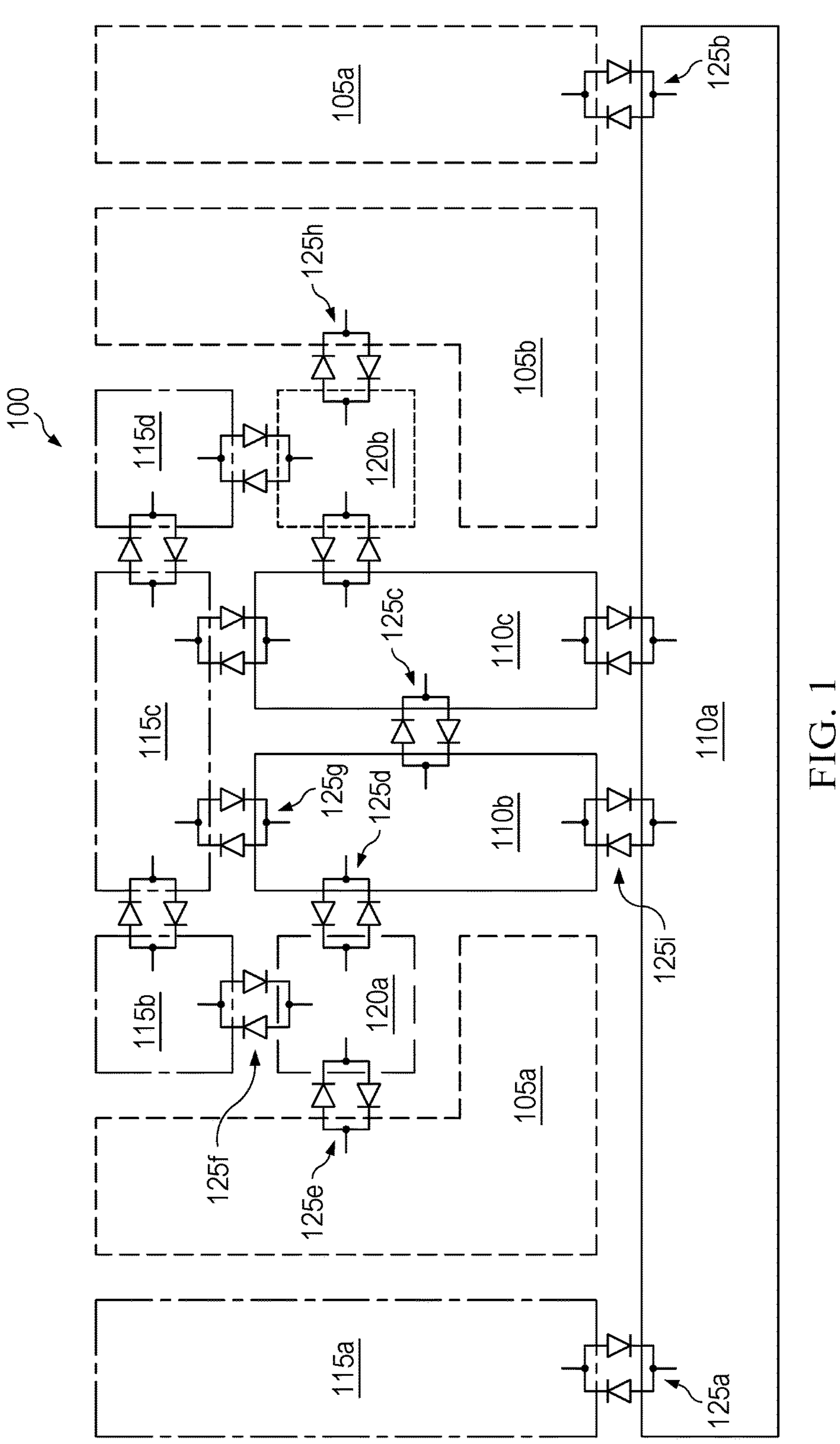
FIG. 1 illustrates a schematic diagram of a semiconductor die having multiple functional blocks and protection devices in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. Corresponding numerals and symbols in different figures generally refer to corresponding parts unless otherwise indicated. It is to be understood that the figures and examples are not meant to limit the scope of the present disclosure to such example embodiments, but other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

Various structures disclosed herein can be formed using semiconductor process techniques. Layers including a variety of materials can be formed over a substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

The semiconductor devices, integrated circuits, or IC components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. The conductivity (or resistivity) of the substrate (or regions of the substrate) can be controlled by doping techniques using various chemical species (which may also be referred to as acceptor or donor dopant atoms) including, but not limited to, boron, indium, arsenic, or phosphorus. Doping may be performed during the initial formation or growth of the substrate (or an epitaxial layer grown on the substrate), by ion-implantation, or other suitable doping techniques. Regions or layers of the substrate doped with p-type dopant atoms (e.g., boron, indium, or other suitable acceptor dopant atoms) may be referred to as p-type (first conductivity type or p-doped) regions, layers, wells, or the like. Similarly, regions or layers of the substrate doped with n-type dopant atoms (e.g., phosphorus, arsenic, or other suitable donor dopant atoms) may be referred to as n-type (second conductivity type or n-doped) regions, layers, wells, or the like.

As used herein, terms such as "first" and "second" are used to arbitrarily distinguish between the elements such terms describe. Thus, these terms in the description and in the claims are not intended to indicate temporal or other prioritization of such elements. Moreover, terms such as "front," "back," "top," "bottom," "over," "under," "vertical," "horizontal," "lateral," "down," "up," "upper," "lower," or the like, are used to refer to relative directions or positions of features in the semiconductor devices in view of the orientation shown in the figures. For example, "upper" or "uppermost" can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein. The term "approximately," as used herein, may refer to ±5% to ±10% variations of the recited values in some cases. In other cases, the term "approximately" may refer to ±10% to ±20% variations of the recited values.

The present disclosure describes semiconductor devices or circuits with high area efficiency. The semiconductor devices in accordance with the present disclosure includes diodes coupled to an isolation structure encircling the semiconductor device. In this manner, the semiconductor devices utilize an area, which may be otherwise left as an inactive space (or dead space), to improve their area efficiency. The semiconductor devices can be placed between different power or ground domains of ICs to isolate noise propagation from one power (or ground) domain to another. In addition, during ESD or surge events, the semiconductor devices can provide a continuous path for current flow between every pair of pins of the ICs, which may be connected to different functional blocks (and thus, different power or ground domains). The semiconductor devices in accordance with the present disclosure experimentally demonstrated approximately 50% or greater area efficiency while maintaining the same or superior performance—e.g., ESD protection capability.

As described in more detail herein, the semiconductor devices may include multiple fingers of doped regions (e.g., strips of a semiconductor substrate doped with n-type or p-type dopant species) arranged horizontally, vertically, or a combination of both. The fingers of doped regions, in conjunction with metal lines connected thereto, are arranged to form diodes connected in parallel but with their anode and cathode terminals reversed—i.e., their polarities reversed. In other words, an anode of a first diode is connected to a cathode of a second diode, and a cathode of the first diode is connected to an anode of the second diode. Such diodes may be referred to as anti-parallel (AP) diodes. Moreover, the fingers of doped regions are arranged in manners to facilitate reducing lengths of the metal lines along the current flow direction during ESD or surge events. Additionally, the metal lines are highly parallelized to facilitate carrying large amount of current. The parallelized metal lines with reduced lengths ameliorate issues associated with parasitic resistance of the metal lines.

FIG. 1 is a schematic diagram of a semiconductor die (or IC) 100 in accordance with embodiments of the present disclosure. The semiconductor die 100 may be a mixed signal semiconductor chip or a power-management IC (PMIC) including multiple functional blocks with their own power domains, for example analog power domains 105 (also identified individually as 105*a* through 105*c*), digital power domains 110 (also identified individually as 110*a* through 110*c*), clock signal power domains 115 (also identified individually as 115*a* through 115*d*), and power domains 120 (also identified individually as 120*a* and 120*b*). The power domains 120 may be application specific—e.g., power signal domains for PMICs. Each individual power domain of the semiconductor die 100 may have different operational characteristics, for example, operating voltage levels, tolerable noise margins, ground potentials, or the like.

The semiconductor die 100 includes AP diodes 125 (some of AP diodes are individually identified as AP diodes 125*a* through 125*i*), each of which includes aspects of the semiconductor devices described with reference to FIGS. 2A through 5. The AP diodes 125 are located between two power domains. For example, AP diode 125*e* is located between the analog power domain 105*a* with analog ground (which may be regarded as relatively silent ground) and the power domain 120*a* with power ground (which may be regarded as relatively noisy ground). The AP diodes 125 mitigate noise propagation between different power domains within certain values—e.g., within 300 mV. In some embodiments, the AP diodes 125 are stacked (e.g., connected in series) such that noise propagation can be mitigated at a greater value—e.g., within 600 mV. Additionally, the AP diodes 125 provide connections between different power domains to safely dissipate current caused by ESD or surge events. In this regard, every pin of the semiconductor die 100 is coupled to another pin through one or more AP diodes 125. For example, a pin connected to the analog power domain 105*a* is coupled to a pin connected to the digital power domain 110*a* through, for instance, AP diodes 125*e*, 125*d*, and 125*i*.

Figure 2A:
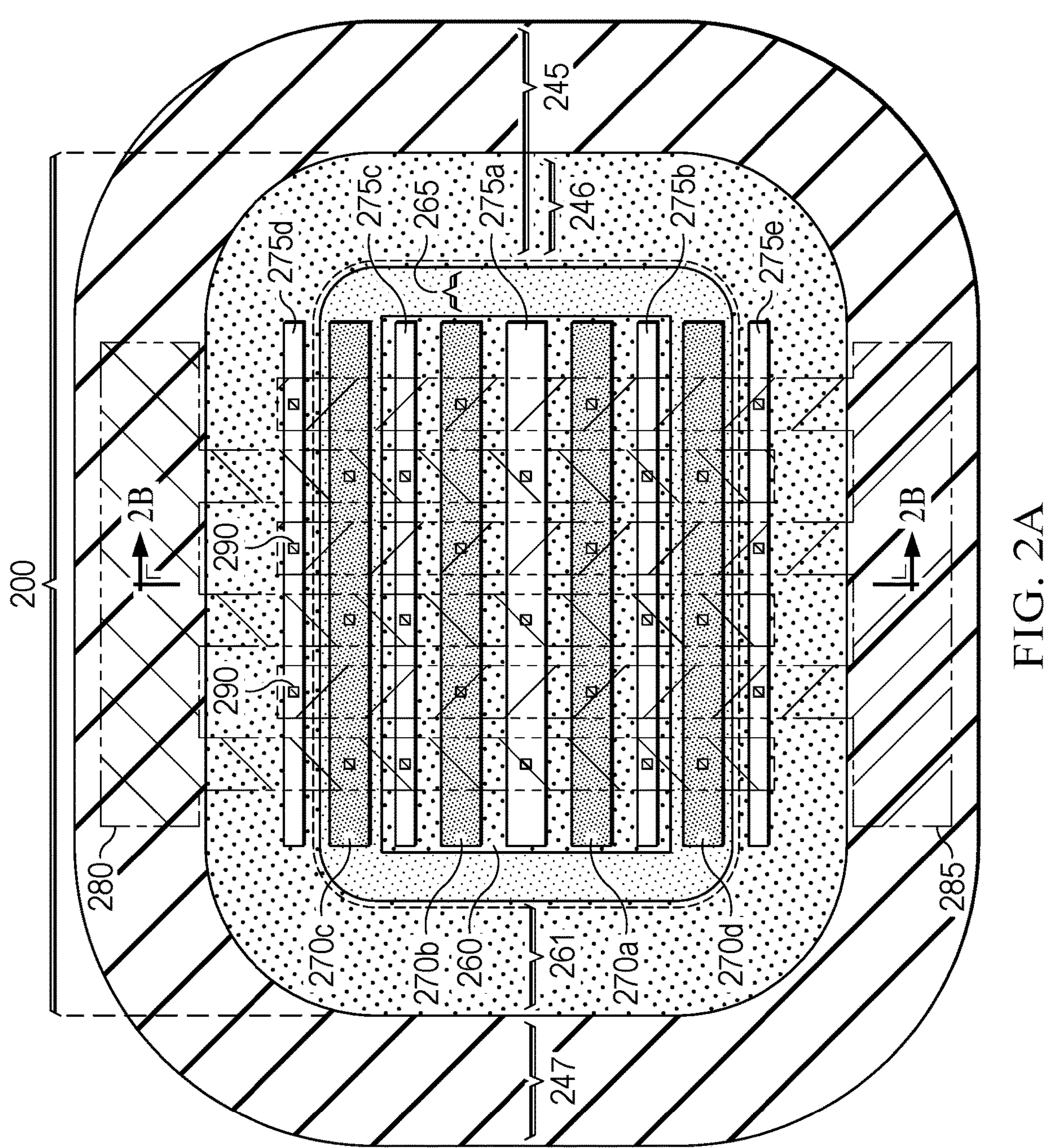
FIGS. 2A through 2C illustrate schematic diagrams and an equivalent circuit of a semiconductor device in accordance with embodiments of the present disclosure.
Figures 2B, 2C:
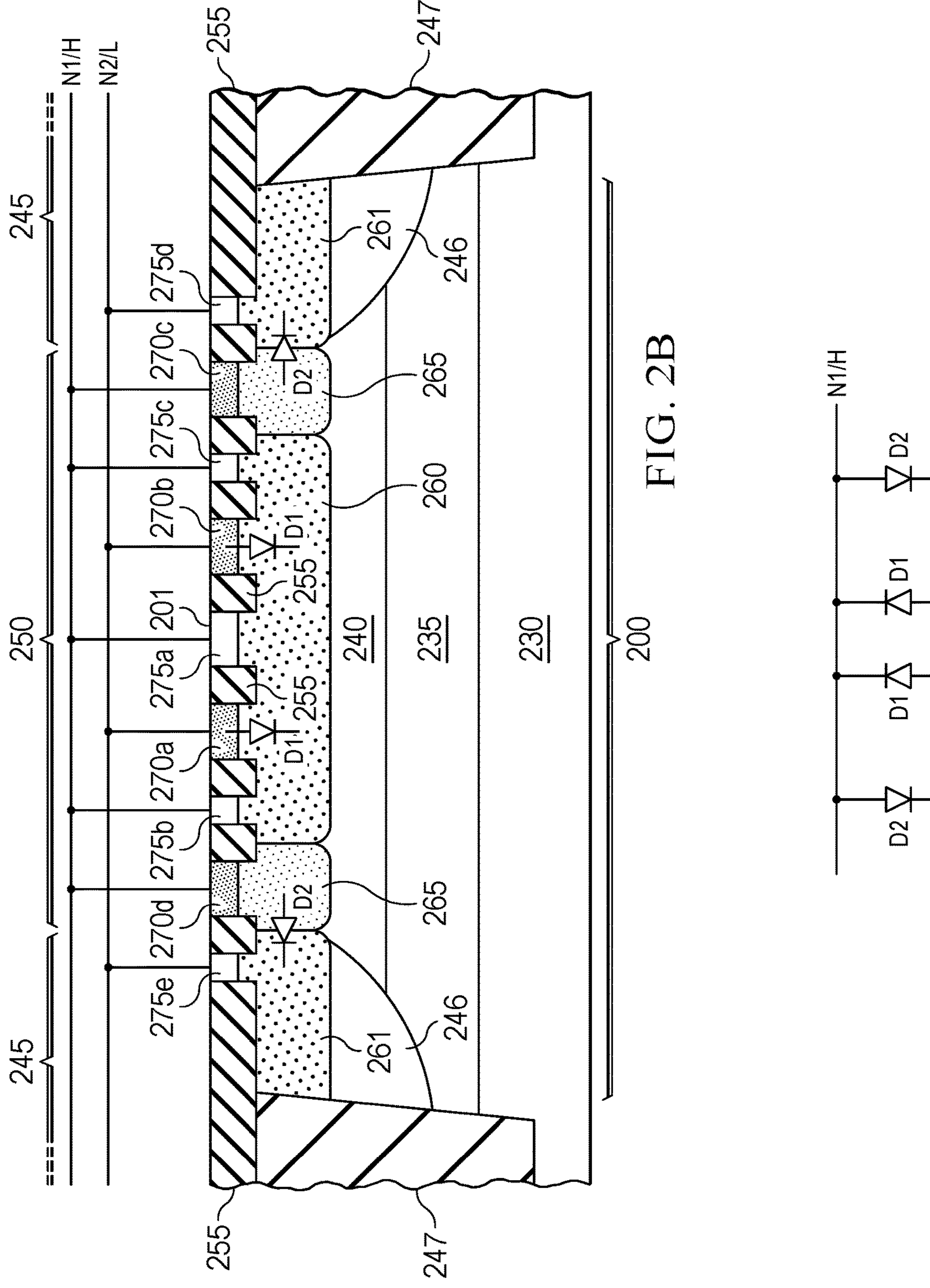

FIGS. 2A through 2C illustrate schematic diagrams and an equivalent circuit of a semiconductor device 200 in accordance with embodiments of the present disclosure. FIG. 2A shows a plan view (which may be regarded as a composite layout) of the semiconductor device 200 surrounded (enclosed, encircled) by an isolation structure 245; FIG. 2B shows a cross-sectional view of the semiconductor device 200 and the isolation structure 245 as marked in FIG. 2A; FIG. 2C is an equivalent circuit of the semiconductor device 200. These figures are described concurrently in the following discussion.

As shown in FIG. 2B, the semiconductor device 200 may be fabricated using a p-type substrate 230, on which an n-type layer 235 is formed. Moreover, the semiconductor device 200 includes a p-type layer 240 formed on the n-type layer 235. As such, the n-type layer 235 is "buried" underneath the p-type layer 240, and may be referred to as an n-type buried layer (NBL). In some embodiments, a net doping density of the NBL 235 may be in the order of approximately $1\times10^{18}$ $cm^{-3}$. In some embodiments, the NBL 235 may be omitted. The p-type layer 240 may be an epitaxial layer including p-type dopant atoms, and may be referred to as a p-type epitaxial layer 240 (epi-layer 240 or p-epi layer 240). In some embodiments, a net doping density of the p-epi layer 240 may be less than $1\times10^{16}$ $cm^{-3}$. In some embodiments, the thickness of the p-epi layer 240 may be approximately 6 micrometers (μm) after completing process steps to form the semiconductor device 200.

The semiconductor device 200 is surrounded by the isolation structure 245 as depicted in FIG. 2A. The isolation structure 245 includes a deep n-doped well 246 (deep n-well 246) and a deep trench isolation (DTI) structure 247. The deep n-well 246 extends from a surface 201 of the p-epi layer 240 of the semiconductor device 200 toward the substrate 230, and connects to the NBL 235. As such, the depth of the deep n-well 246 is greater than the thickness of the epi-layer 240 (e.g., approximately 6 μm). In some embodiments, the depth of the deep n-well 246 may be approximately 9 μm from the surface 201. In some embodiments, a net doping density of the deep n-well 246 may be in the order of approximately $1\times10^{18}$ $cm^{-3}$ The area encircled by the isolation structure 245 (e.g., the deep n-well 246) may be referred to as an isolation tank 250. As such, the isolation tank 250 may refer to the p-epi layer 240 confined by the n-type regions. In other words, the isolation tank 250 may be laterally surrounded by the deep n-well region 246 and vertically separated from the substrate 230 by the NBL 235.

In some embodiments, the DTI structure 247 may be omitted from the isolation structure 245 as described with reference to FIG. 5. In such embodiments, the thickness of the p-epi layer may be approximately 3 μm after completing process steps to form the semiconductor device (e.g., semiconductor device 500). Moreover, the depth of the deep n-well is greater than the thickness of the epi-layer (e.g., approximately 3 μm), which can be as deep as approximately 5.7 μm from the surface 201.

The semiconductor device 200 includes a first n-doped well 260 (first n-well 260). The semiconductor device 200 also includes a p-doped well 265 (p-well 265) that surrounds the first n-well 260. The semiconductor device 200 also includes a second n-doped well 261 (second n-well 261) that surrounds the p-well 265. The second n-well 261 at least partially overlaps the deep n-well 246. Moreover, the second n-well 261 may abut the DTI structure 247 if the isolation structure 245 includes the DTI structure 247. In some embodiments, the first and second n-wells 260 and 261 are simultaneously formed—e.g., by performing ion-implantation process steps introducing n-type dopant atoms after forming a photoresist pattern that opens the regions corresponding to the first and second n-wells 260 and 261. Net dopant concentrations of the n-doped and p-doped wells may be in the order of approximately $1\times10^{18}$ $cm^{-3}$. In some embodiments, the depths of the n-wells 260 and 261 and the p-well 265 may be approximately 1.4 μm from the surface 201. As such, the n-wells 260 and 261 and the p-well 265 may be referred to as shallow n-wells and a shallow p-well in view of their relatively shallower dopant profiles in comparison to the deep n-well 246 having a relatively deeper dopant profile as illustrated in FIG. 2B.

The first n-well 260 includes at least one p-doped regions 270 (FIGS. 2A and 2B illustrates two p-doped regions 270*a* and 270*b*) and at least one n-doped regions 275 (FIGS. 2A and 2B illustrates three n-doped regions 275*a* through 275*c*). As shown in FIGS. 2A and 2B, the p-doped regions 270 and the n-doped regions 275 within the first n-well 260 alternate each other. The p-doped regions 270 located within the first n-well 260 form first pn junctions that correspond to first diodes D1 as denoted in FIGS. 2B and 2C. The first n-well 260 is coupled to a first terminal N1/H (which may be referred to as a node 1 or a high node) through the n-doped regions 275 (e.g., n-doped regions 275*a*-275*c*) within the first n-well 260. The p-doped regions 270 within the first n-well 260 are coupled to a second terminal N2/L (which may be referred to as a node 2 or a low node). The first and second terminals (e.g., a high node and a low node) are arbitrarily designated and thus, interchangeable without affecting operations of the semiconductor device 200. Net dopant concentrations of the n-doped regions (which may be referred to as n+ regions) and the p-doped regions (which may be referred to as p+ regions) may be greater than $1\times10^{18}$ $cm^{-3}$. The semiconductor device 200 also includes shallow trench isolation (STI) structures 255 as shown in FIG. 2B, which separates (isolates) individual p-doped and n-doped regions 270 and 275 from each other. In some embodiments, isolation structures other than STI structures 255 may be formed to separate the individual p-doped and n-doped regions 270 and 275 from each other, for example, local oxidation of silicon (LOCOS) structures, silicide-block structures, polycrystalline-silicon structures, or the like.

As described above, the p-well 265 surrounds the first n-well 260, and the second n-well 261 surrounds the p-well 265. As such, the p-well 265 is located between the first and second n-wells 260 and 261 such that an inner boundary of the p-well 265 abuts the first n-well 260 and an outer boundary of the p-well 265 abuts the second n-well 261. Namely, the second n-well 261 is adjacent to the outer boundary of the p-well 265. The outer boundary of the p-well 265 in contact with the second n-well 261 forms a second pn junction that corresponds to the second diode D2 as denoted in FIGS. 2B and 2C. In other words, the second diode D2 (i.e., the second pn junction) forms at the interface between the p-well 265 and the second n-well 261 along the outer boundary (or periphery) of the p-well 265. The p-well 265 is coupled to the first terminal N1/H through p-doped regions (e.g., p-doped regions 270*c* and 270*d*) within the p-well 265. The second n-well 261 is coupled to the second terminal N2/L through n-doped regions (e.g., n-doped regions 275*d* and 275*e*) within the second n-well 261. As the second n-well 261 overlaps the deep n-well 246, the n-doped regions (e.g., n-doped regions 275*d* and 275*e*) connecting the second n-well 261 to the second terminal N2/L may be regarded as located within the deep n-well 246.

In this manner, the first diodes D1 and the second diodes D2 form anti-parallel diodes as shown in FIG. 2C. In other words, an anode (e.g., the p-doped region 270*a*) of the first diode D1 is connected to a cathode (e.g., the second n-well 261) of the second diode D2 at the second terminal N2/L, and a cathode (e.g., the first n-well 260) the of the first diode D1 is connected to an anode (e.g., the p-well 265) of the second diode D2 at the first terminal N1/H. The AP diodes 125 described with reference to FIG. 1 may be examples of or include aspects of the semiconductor device 200.

The semiconductor device 200 includes a first conductive structure 280 corresponding to the first terminal N1/H and a second conductive structure 285 corresponding to the second terminal N2/L as shown in FIG. 2A. In some embodiments, the first and second conductive structures 280 and 285 includes metal lines (e.g., aluminum, copper, tungsten). Moreover, the semiconductor device 200 includes contacts 290 connecting the first and second conductive structures 280 and 285 to the respective p-doped and n-doped regions 270 and 275. The p-doped and n-doped regions 270 and 275 extend in a first direction (e.g., a horizontal direction as in the orientation of the semiconductor device 200 shown in FIG. 2A) parallel to each other along the surface 201 of the p-epi layer 240. The first and second conductive structures 280 and 285 include portions (strips or fingers) covering the contacts 290, which are extended in a second direction perpendicular to the first direction (e.g., a vertical direction as in the orientation of the semiconductor device 200 shown in FIG. 2A).

The layout configurations of the conductive structures 280 and 285 with respect to the p-doped and n-doped regions 270 and 275, in conjunction with locations of the contacts 290 connecting the p-doped and n-doped regions 270 and 275 to the respective conductive structures 280 and 285, facilitate reducing the distance that current flows through the conductive structures 280 and 285—e.g., during ESD or surge events. The reduced distance shortens lengths of the conductive strips of the first and second conductive structures 280 and 285, thereby reducing their sheet resistance such that the amount of voltage drop on the conductive strips can be reduced. The conductive structures 280 and 285 with the multiple strips parallel to each other further assist to improve current handling capability of the semiconductor device 200.

Moreover, the footprint of the semiconductor device 200 overlaps with part of the isolation structure 245. For example, the second n-well 261 of the semiconductor device 200 overlaps the deep n-well 246 of the isolation structure 245. In other words, the semiconductor device 200 stretches (e.g., expands) beyond the boundary of the isolation tank 250. In this manner, the semiconductor device 200 has an improved area efficiency when compared to other AP-diode layouts that are confined inside the isolation tank 250 with certain distances away from the boundary of the isolation tank 250 (e.g., the deep n-well 246).

Although FIGS. 2A through 2C illustrates the first n-well 260 includes two p-doped regions 270 and three n-doped regions 275, the present disclosure is not limited thereto. For instance, the first n-well 260 may include one p-doped region 270 located between two n-doped regions 275. Moreover, the first n-well 260 may include three or more p-doped regions 270 and four or more n-doped regions 275 that alternate with each other.

Figure 3A:
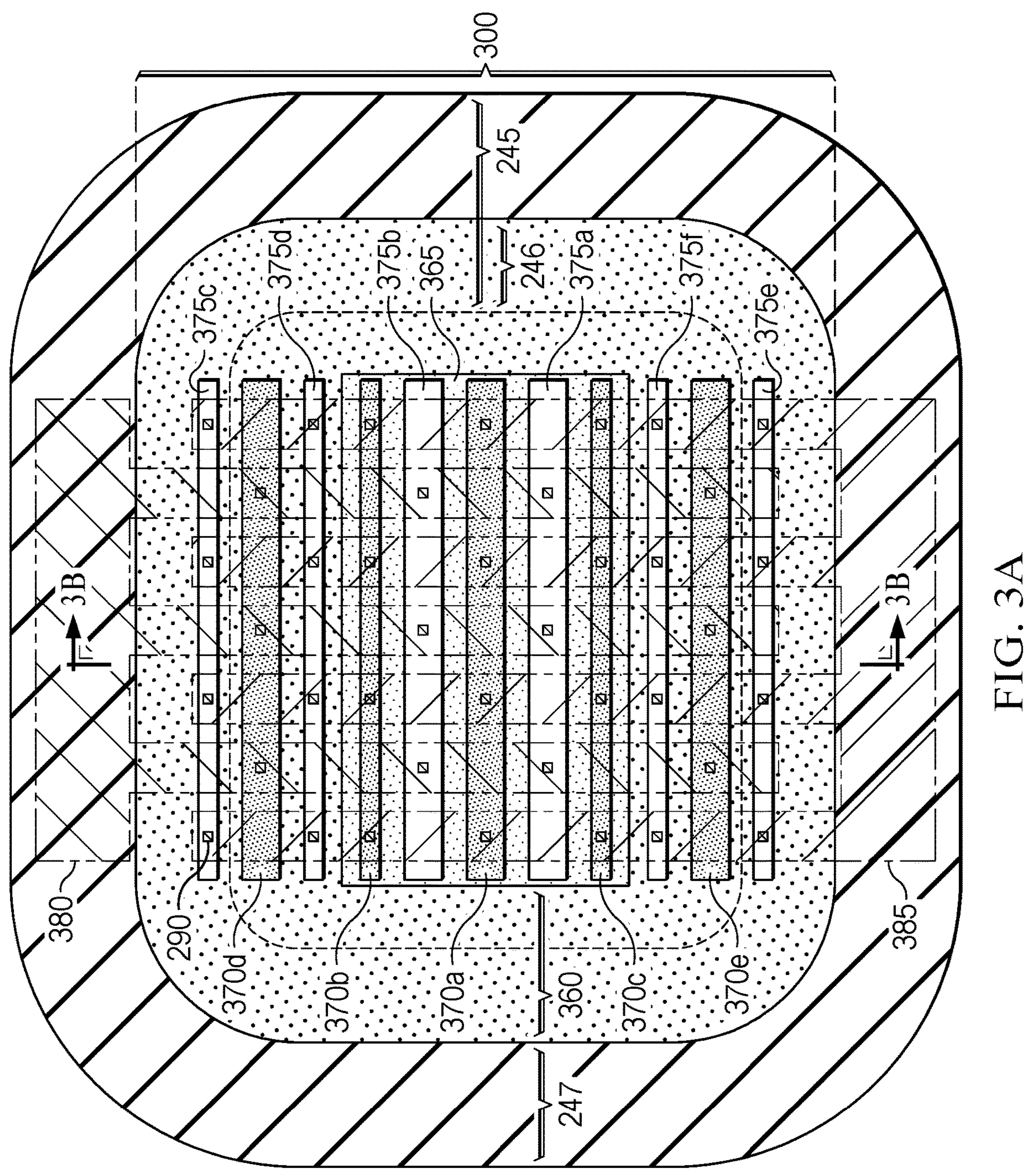
FIGS. 3A through 3C illustrate schematic diagrams and an equivalent circuit of a semiconductor device in accordance with embodiments of the present disclosure.
Figures 3B, 3C:
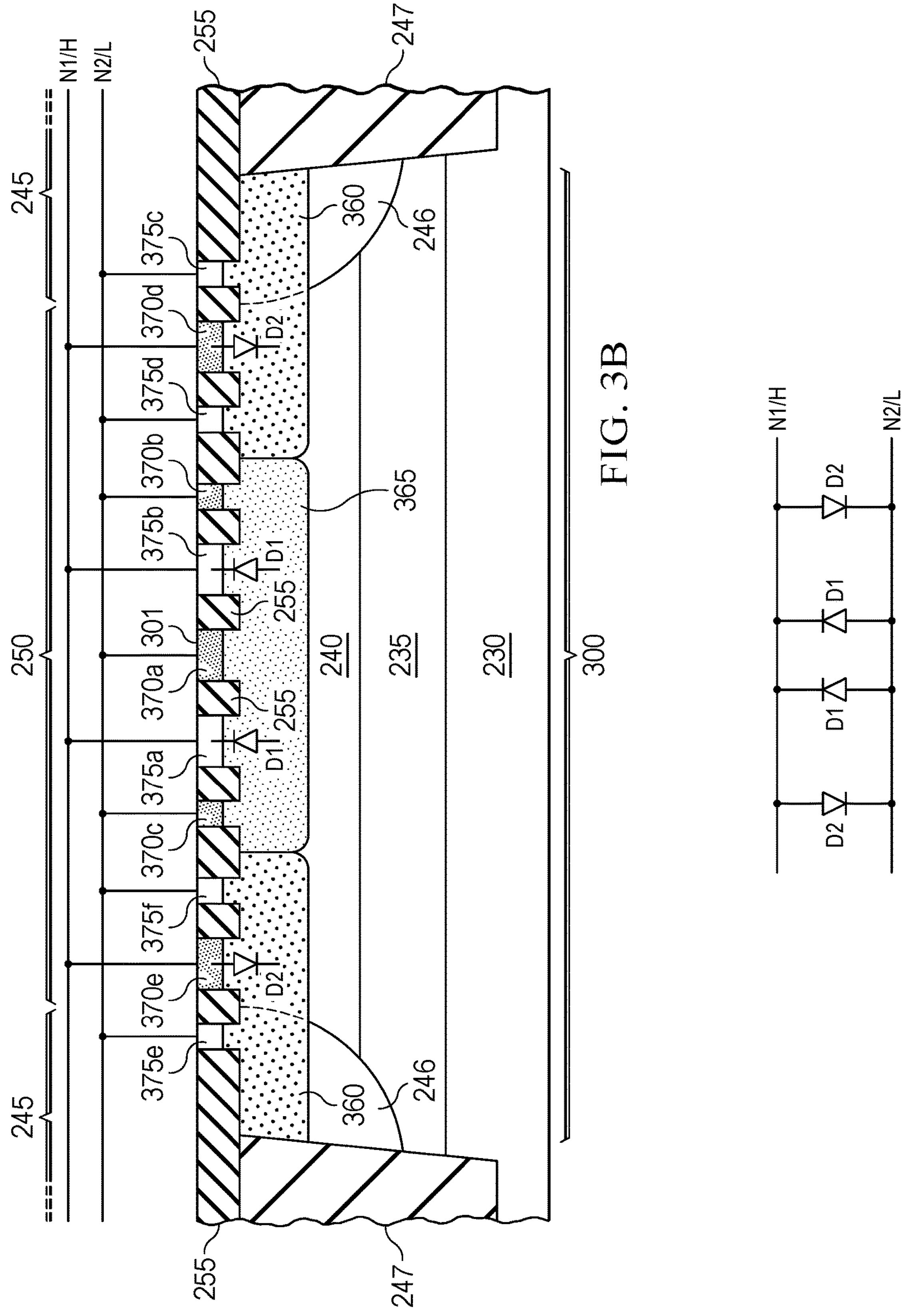

FIGS. 3A through 3C illustrate schematic diagrams and an equivalent circuit of a semiconductor device 300 in accordance with embodiments of the present disclosure. FIG. 3A shows a plan view (which may be regarded as a composite layout) of the semiconductor device 300 surrounded by an isolation structure 245; FIG. 3B shows a cross-sectional view of the semiconductor device 300 and the isolation structure 245 as marked in FIG. 3A; FIG. 3C is an equivalent circuit of the semiconductor device 300. These figures are described concurrently in the following discussion.

The semiconductor device 300 includes aspects of the semiconductor device 200 described with reference to FIGS. 2A through 2C. For example, the semiconductor device 300 includes a p-type substrate 230, an n-type buried layer (NBL) 235, and a p-epi layer 240 as shown in FIG. 3B. Moreover, the semiconductor device 300 is surrounded by the isolation structure 245 that includes a deep n-doped well 246 (deep n-well 246) and a deep trench isolation (DTI) structure 247. The deep n-well 246 extends from the surface 301 of the semiconductor device 300 toward the substrate 230, and connects to the NBL 235. The area encircled by the isolation structure 245 (e.g., the deep n-well 246) may be referred to as an isolation tank 250.

The semiconductor device 300 includes a p-doped well 365 (p-well 365). The semiconductor device 300 also includes an n-doped well 360 (n-well 360) that surrounds the p-well 365. The n-well 360 at least partially overlaps the deep n-well 246. Moreover, the n-well 360 may abut the DTI structure 247 if the isolation structure 245 includes the DTI structure 247. The n-well 360 and p-well 365 include aspects of the first and second n-wells 260 and 261 and the p-well 265, respectively—e.g., dopant profiles, net dopant concentrations. As such, the n-well 360 and the p-well 365 may be referred to as a shallow n-well and a shallow p-well.

The p-well 365 includes at least one n-doped regions 375 (FIGS. 3A and 3B illustrate two n-doped regions 375*a* and 375*b*, which include aspects of the n-doped regions 275) and at least one p-doped regions 370 (FIGS. 3A and 3B illustrate three p-doped regions 370*a* through 370*c*, which include aspects of the p-doped regions 270). As shown in FIGS. 3A and 3B, the p-doped regions 370 and the n-doped regions 375 within the p-well 365 alternate each other. The n-doped regions 375 located within the p-well 365 form first pn junctions that correspond to first diodes D1 as denoted in FIGS. 3B and 3C. The n-doped regions 375 within the p-well 365 are coupled to a first terminal N1/H (which may be referred to as a node 1 or a high node). The p-well 365 is coupled to a second terminal N2/L (which may be referred to as a node 2 or a low node) through the p-doped regions 370 within the p-well 365 (e.g., p-doped regions 370*a*-370*c*).

As described above, the n-well 360 surrounds (e.g., encloses) the p-well 365. Moreover, the n-well 360 includes at least one p-doped regions 370 (FIGS. 3A and 3B illustrates two p-doped regions 370*d* and 370*e*) and at least one n-doped regions 375 (FIGS. 3A and 3B illustrates four n-doped regions 375*c* through 375*f*). The p-doped regions 370 (e.g., p-doped regions 370*d* and 370*e*) located within the n-well 360 form second pn junctions that correspond to second diodes D2 as denoted in FIGS. 3B and 3C. The p-doped regions 370 (e.g., p-doped regions 370*d* and 370*e*) within the n-well 360 are coupled to the first terminal N1/H. The n-well 360 is coupled to the second terminal N2/L through the n-doped regions 375 (e.g., n-doped regions 375*c* through 375*f*) within the n-well 360. As described above, the n-well 360 overlaps the deep n-well 246. Accordingly, some of the n-doped regions 375 within the n-well 360 (e.g., n-doped regions 375*c* and 375*e*) may be also regarded as located within the deep n-well 246.

In this manner, the first diodes D1 and the second diodes D2 form anti-parallel diodes as shown in FIG. 3C. In other words, an anode (e.g., the p-well 365) of the first diode D1 is connected to a cathode (e.g., the n-well 360) of the second diode D2 at the second terminal N2/L, and a cathode (e.g., the n-doped region 375*a*) of the first diode D1 is connected to an anode (e.g., the p-doped region 370*e*) of the second diode D2 at the first terminal N1/H. The AP diodes 125 described with reference to FIG. 1 may be examples of or include aspects of the semiconductor device 300.

The semiconductor device 300 includes a first conductive structure 380 corresponding to the first terminal N1/H and a second conductive structure 385 corresponding to the second terminal N2/L, which are shown in FIG. 3A. The first and second conductive structures 380 and 385 includes aspects of the first and second conductive structures 280 and 285 described with reference to FIG. 2A. The semiconductor device 300 also includes contacts 290 connecting the first and second conductive structures 380 and 385 to the respective p-doped and n-doped regions 370 and 375. The p-doped and n-doped regions 370 and 375 extend in a first direction (e.g., a horizontal direction as in the orientation of the semiconductor device 300 shown in FIG. 3A) parallel to each other along the surface 301 of the semiconductor device 300. The first and second conductive structures 380 and 385 include portions (strips or fingers) covering the contacts 290, which are extended in a second direction perpendicular to the first direction (e.g., a vertical direction as in the orientation of the semiconductor device 300 shown in FIG. 3A).

As with the semiconductor device 200, the layout configurations of the conductive structures 380 and 385 with respect to the p-doped and n-doped regions 370 and 375, in conjunction with the locations of the contacts 290 connecting the p-doped and n-doped regions 370 and 375 to the respective conductive structures 380 and 385, facilitate reducing the distance that current flows through the conductive structures 380 and 385—e.g., during ESD or surge events. The reduced distance shortens lengths of the conductive strips of the first and second conductive structures 380 and 385, thereby reducing their sheet resistance such that the amount of voltage drop on the conductive strips can be reduced. The conductive structures 380 and 385 with the multiple strips parallel to each other further assist to improve current handling capability of the semiconductor device 300.

Moreover, the footprint of the semiconductor device 300 overlaps with part of the isolation structure 245. For example, the n-well 360 of the semiconductor device 300 at least partially overlaps the deep n-well 246 of the isolation structure 245. In other words, the semiconductor device 300 stretches (e.g., expands) beyond the boundary of the isolation tank 250. In this manner, the semiconductor device 300 has an improved area efficiency when compared to other AP-diode layouts that are confined inside the isolation tank 250 with certain distances away from the boundary of the isolation tank 250 (e.g., the deep n-well 246).

Although FIGS. 3A through 3C illustrates the p-well 365 includes two n-doped regions 375 and three p-doped regions 370, the present disclosure is not limited thereto. For instance, the p-well 365 may include one n-doped region 375 and two p-doped regions 370, each of the p-doped regions 370 located next to a respective side of the n-doped region 375. Moreover, the p-well 365 may include three or more n-doped regions 375 and four or more p-doped regions 370 alternating with each other. Similarly, the quantities of the n-doped regions 375 and the p-doped regions 370 within the n-well 360 may be varied (reduced or increased when compared to those of FIGS. 3A and 3B) within the scope of the present disclosure. For example, instead of having two n-doped regions 375*c* and 375*d* (or n-doped regions 375*e* and 375*f*) on each sides of the p-doped region 370*d* (or p-doped region 370*e*), the n-doped region 375*d* (or n-doped region 375*f*) may be omitted.

Figure 4:
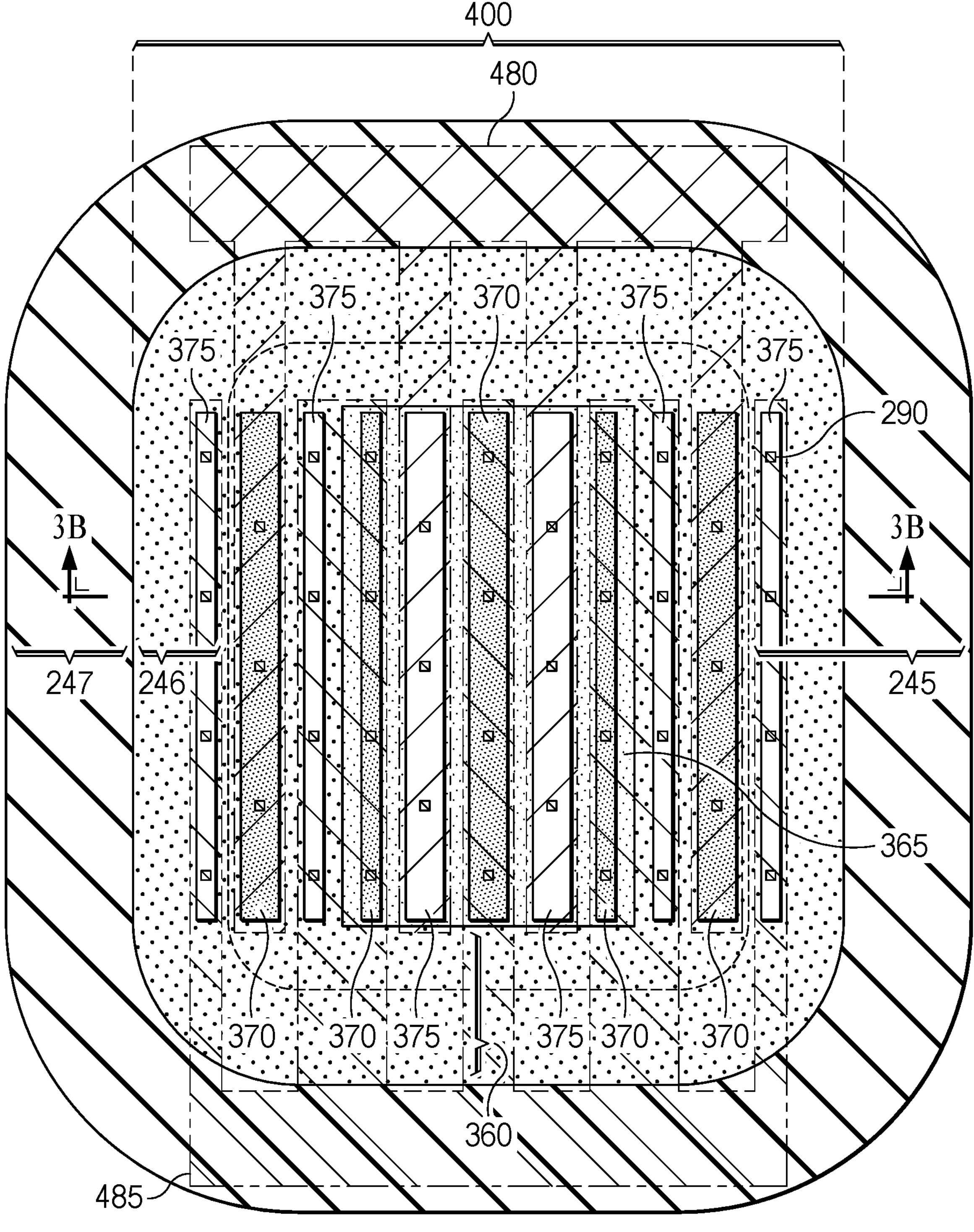
FIG. 4 illustrates a schematic diagram of a semiconductor device in accordance with embodiments of the present disclosure.

FIG. 4 illustrates a schematic diagram of a semiconductor device 400 in accordance with embodiments of the present disclosure. The semiconductor device 400 includes aspects of the semiconductor devices 200 and 300 described with reference to FIGS. 2A through 3C. For example, the semiconductor device 400 includes a p-type substrate 230, an n-type buried layer (NBL) 235, and a p-epi layer 240 as shown in FIG. 3B. FIG. 4 shows a plan view (which may be regarded as a composite layout) of the semiconductor device 400 surrounded by an isolation structure 245. The semiconductor device 400 may be regarded as a variation of the semiconductor device 300 in that the n-type regions and the p-type regions 370 and 375 are rotated by 90-degrees for the semiconductor device 400. As such, the cross-sectional view shown in FIG. 3B corresponds to a cross-sectional view of the semiconductor device 400 as marked in FIG. 4.

The semiconductor device 400 includes first and second conductive structures 480 and 485 corresponding to the respective first terminal N1/H and the second terminal N2/L. In this regard, the first and second conductive structures 480 and 485 may be considered to have modified layouts of the first and second conductive structures 380 and 385 to form the AP-diodes based on the placement of the n-type regions 375 and the p-type regions 370 of the semiconductor device 400. Moreover, contacts 290 are distributed such that the p-doped and n-doped regions 370 and 375 can be appropriately coupled to the respective first and second conductive structures 480 and 485. Accordingly, the equivalent circuit shown in FIG. 3C applies to the semiconductor device 400.

As with the semiconductor device 300, the n-doped regions 375 located within the p-well 365 form first pn junctions that correspond to first diodes D1 as denoted in FIGS. 3B and 3C. The n-doped regions 375 within the p-well 365 are coupled to the conductive structure 480 corresponding to the first terminal N1/H. The p-well 365 is coupled to the conductive structure 485 corresponding to the second terminal N2/L through the p-doped regions 370 within the p-well 365.

The n-well 360 surrounds (e.g., encloses) the p-well 365. The p-doped regions 370 located within the n-well 360 form second pn junctions that correspond to second diodes D2 as denoted in FIGS. 3B and 3C. The p-doped regions 370 within the n-well 360 are coupled to the conductive structure 480 corresponding to the first terminal N1/H. The n-well 360 is coupled to the conductive structure 485 corresponding to the second terminal N2/L through the n-doped regions 375 within the n-well 360 (or within the deep n-well 246).

In this manner, the first diodes D1 and the second diodes D2 form anti-parallel diodes as shown in FIG. 3C. In other words, an anode (e.g., the p-well 365) of the first diode D1 is connected to a cathode (e.g., the n-well 360) of the second diode D2 at the second terminal N2/L, and a cathode (e.g., the n-doped region 375 within the p-well 365) of the first diode D1 is connected to an anode (e.g., the p-doped region 370 within the n-well 360) of the second diode D2 at the first terminal N1/H. The AP diodes 125 described with reference to FIG. 1 may be examples of or include aspects of the semiconductor device 400.

As shown in FIG. 4, the p-doped and n-doped regions 370 and 375 extend in a second direction (e.g., a vertical direction as in the orientation of the semiconductor device 400 shown in FIG. 4) parallel to each other along the surface of the semiconductor device 400. The first and second conductive structures 480 and 485 include portions (strips or fingers) covering the contacts 290, which are extended in the same direction (e.g., the second direction, vertical direction) as the p-doped and n-doped regions 370 and 375.

As with the semiconductor devices 200 and 300, the layout configurations of the conductive structures 480 and 485 with respect to the p-doped and n-doped regions 370 and 375, in conjunction with the locations of the contacts 290 connecting the p-doped and n-doped regions 370 and 375 to the respective conductive structures 480 and 485, facilitate reducing the distance that current flows through the conductive structures 480 and 485—e.g., during ESD or surge events. The reduced distance shortens lengths of the conductive strips of the first and second conductive structures 480 and 485, thereby reducing their sheet resistance such that the amount of voltage drop on the conductive strips can be reduced. The conductive structures 480 and 485 with the multiple strips parallel to each other further assist to improve current handling capability of the semiconductor device 400. Moreover, the footprint of the semiconductor device 400 overlaps with part of the isolation structure 245—e.g., the n-well 360 of the semiconductor device 400 overlapping the deep n-well 246 of the isolation structure 245 such that the semiconductor device 400 has an improved area efficiency.

Figure 5:
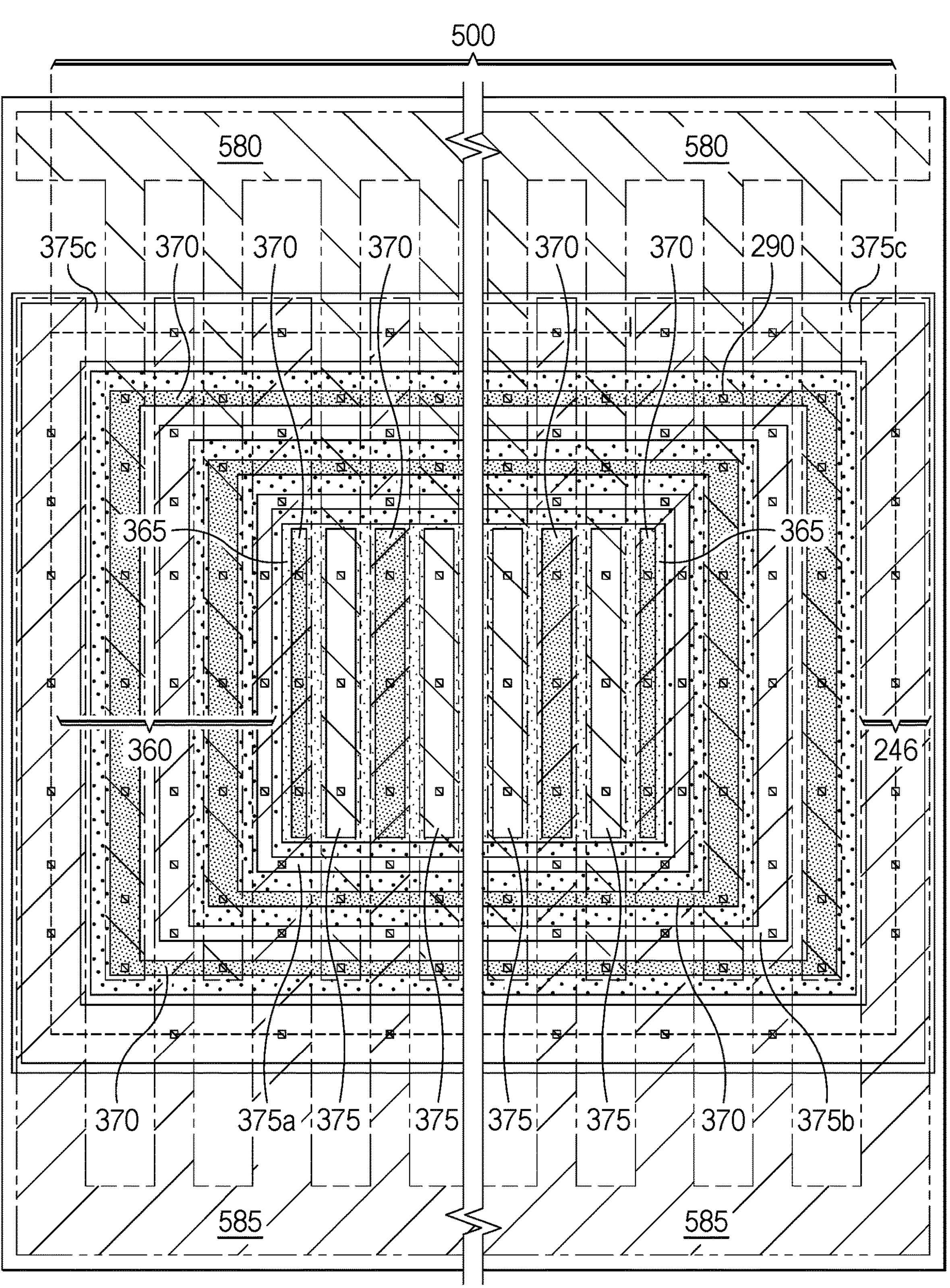
FIG. 5 illustrates a schematic diagram of a semiconductor device in accordance with embodiments of the present disclosure.

FIG. 5 illustrates a schematic diagram of a semiconductor device 500 in accordance with embodiments of the present disclosure. FIG. 5 shows a plan view (which may be regarded as a composite layout) of the semiconductor device 500 surrounded by an isolation structure including a deep n-well 246. In comparison to the isolation structure 245, the isolation structure surrounding the semiconductor device 500 lacks a DTI structure—e.g., having the DTI structure 247 omitted from the isolation structure 245. The semiconductor device 500 includes aspects of the semiconductor devices 200, 300, and 400 described with reference to FIGS. 2A through 4. For example, the semiconductor device 500 includes a p-type substrate 230, an n-type buried layer (NBL) 235, and a p-epi layer 240 described with reference to FIGS. 2B and 3B. The deep n-well 246 extends from the surface of the semiconductor device 500 toward the substrate 230, and connects to the NBL 235. The area surrounded by the isolation structure (e.g., the deep n-well 246) may be referred to as an isolation tank. The semiconductor device 500 may be regarded as a variation of the semiconductor device 400 in that the n-type regions and the p-type regions 370 and 375 that are outside the p-well 365 are modified to improve the area efficiency for the semiconductor device 500.

The semiconductor device 500 includes a p-doped well 365 (p-well 365). The semiconductor device 500 also includes an n-doped well 360 (n-well 360) that surrounds (e.g., encloses) the p-well 365. The n-well 360 at least partially overlaps the deep n-well 246. The n-well 360 and p-well 365 include aspects of the first and second n-wells 260 and 261 and the p-well 265, respectively—e.g., dopant profiles, net dopant concentrations. As such, the n-well 360 and the p-well 365 may be referred to as a shallow n-well and a shallow p-well.

The p-well 365 includes at least one n-doped regions 375 (FIG. 5 illustrates a plurality of n-doped regions 375) and at least one p-doped regions 370 (FIG. 5 illustrates a plurality of p-doped regions 370). As shown in FIG. 5, the p-doped regions 370 and the n-doped regions 375 within the p-well 365 alternate each other. The n-doped regions 375 located within the p-well 365 form first pn junctions that correspond to first diodes D1 (e.g., D1 diode denoted in FIGS. 3B and 3C). The n-doped regions 375 within the p-well 365 are coupled to a first conductive structure 580 corresponding to a first terminal N1/H (which may be referred to as a node 1 or a high node). The p-well 365 is coupled to a second conductive structure 585 corresponding to a second terminal N2/L (which may be referred to as a node 2 or a low node) through the p-doped regions 370 within the p-well 365.

As described above, the n-well 360 surrounds (e.g., encloses) the p-well 365. Moreover, the n-well 360 includes at least one p-doped regions 370 (FIG. 5 illustrates two p-doped regions 370) and at least one n-doped regions 375 (FIG. 5 illustrates two n-doped regions 375*a* and 375*b*). Moreover, FIG. 5 depicts one n-doped region 375*c* that straddles the deep n-well 246 and the n-well 360. The p-doped regions 370 located within the n-well 360 form second pn junctions that correspond to second diodes D2 (e.g., D2 diode denoted in FIGS. 3B and 3C). The n-doped regions 375 and the p-doped regions 370 outside the p-well 365 surround (e.g., encloses) the p-well 365. In this manner, most of the area of the isolation tank is utilized as either the n-doped region 375 and the p-doped regions 370 such that the area efficiency of the semiconductor device 500 can be further enhanced.

The p-doped regions 370 within the n-well 360 are coupled to the first terminal N1/H (the first conductive structure 580). The n-well 360 is coupled to the second terminal N2/L (the second conductive structure 585) through the n-doped regions 375 within the n-well 360. Moreover, the n-doped region 375*c* that straddles the deep n-well 246 and the n-well 360 is also coupled to the second terminal N2/L. In this manner, the first diodes D1 and the second diodes D2 of the semiconductor device 500 form anti-parallel diodes as shown in FIG. 3C. The AP diodes 125 described with reference to FIG. 1 may be examples of or include aspects of the semiconductor device 500.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. For example, although examples described above with reference to FIGS. 2A through 5 include various doped portions (e.g., n-wells, p-wells, deep n-wells, n-doped and p-doped regions) based on a p-type epi-layer formed over a p-type substrate, in some embodiments, anti-parallel diodes can be fabricated based on an n-type epi-layer formed over an n-type substrate in conjunctions with the various doped portions being opposite polarities—e.g., interchanging acceptor and donor dopant atoms. Moreover, in some embodiments, the various doped portions may be formed in a substrate (n-type or p-type wafers) absent an epi-layer formed over the substrate. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A semiconductor device, comprising:

a first diode including a first pn junction across a p-doped region and a first n-well including the p-doped region, wherein the first n-well is coupled to a first terminal and the p-doped region is coupled to a second terminal; and a second diode including a second pn junction across a p-well and a second n-well adjacent to the p-well, wherein:

the p-well is coupled to the first terminal;

the p-well encircles and interfaces with an entire outer perimeter of the first n-well; and the second n-well is coupled to the second terminal and overlaps a third n-well of an isolation structure surrounding the semiconductor device.

2. The semiconductor device of claim 1, wherein the p-well abuts the first n-well.

3. The semiconductor device of claim 1, wherein the first n-well is coupled to the first terminal through an n-doped region within the first n-well.

4. The semiconductor device of claim 1, wherein the p-well is coupled to the first terminal through a p-doped region within the p-well.

5. The semiconductor device of claim 1, wherein the second n-well is coupled to the second terminal through an n-doped region within the second n-well.

6. The semiconductor device of claim 1, wherein the isolation structure includes a deep trench isolation (DTI) structure that abuts the second n-well.

7. The semiconductor device of claim 1, wherein the third n-well is coupled to an n-type buried layer, over which the first and second diodes are located.

8. The semiconductor device of claim 1, wherein the p-well is coupled to a p-type epitaxial layer, over which the first and second diodes are located.

9. The semiconductor device of claim 1, wherein the p-well surrounds the first n-well and the second n-well surrounds the p-well.

10. The semiconductor device of claim 1, wherein the second terminal includes a conductive structure, wherein:

the p-doped region extends in a first direction along a surface of the semiconductor device; and the conductive structure includes a portion extending in a second direction perpendicular to the first direction, the portion covering a contact to the p-doped region.

11. The semiconductor device of claim 1, wherein the first and second diodes form an anti-parallel diode.

12. The semiconductor device of claim 1, wherein the third n-well of the isolation structure is spaced apart from the p-well and the first n-well.

13. The semiconductor device of claim 1, wherein the third n-well extends under the second n-well without extending under the first n-well and the p-well.

14. The semiconductor device of claim 1, wherein the p-well is free of including any n-doped regions.

15. The semiconductor device of claim 1, wherein the isolation structure extends to a greater depth than the first n-well, the second n-well, and the p-well.

16. A semiconductor device, comprising:

a first diode including a first pn junction across a p-doped region and a first n-well including the p-doped region, wherein the first n-well is coupled to a first terminal and the p-doped region is coupled to a second terminal;

a second diode including a second pn junction across a p-well and a second n-well adjacent to the p-well, wherein the second n-well includes a n-doped region having a greater concentration of n-type dopants than the second n-well, wherein the p-well is coupled to the first terminal and the second n-well is coupled to the second terminal through the n-doped region;

a third n-well of an isolation structure surrounding the semiconductor device, the second n-well disposed over the third n-well; and a p-type semiconductor layer, wherein the first n-well, the second n-well, and the p-well interface with the p-type semiconductor layer.

17. The semiconductor device of claim 16, wherein:

the isolation structure further includes a deep trench isolation structure; and the second n-well and the third n-well interface with the deep trench isolation structure.

18. The semiconductor device of claim 16, wherein the third n-well interfaces with the p-type semiconductor layer.

19. The semiconductor device of claim 16, further comprising a n-type buried layer, the third n-well and the p-type semiconductor layer interfacing with the n-type buried layer.

20. The semiconductor device of claim 16, wherein the p-doped region is a first p-doped region, the semiconductor device further comprising:

a second p-doped region included within the p-well and having a greater concentration of p-type dopants than the p-well; and a dielectric isolation structure extending from the second p-doped region included in the p-well to the n-doped region included in the second n-well.

21. A semiconductor device, comprising:

a first diode including a first pn junction across a p-doped region and a first n-well including the p-doped region, wherein the first n-well is coupled to a first terminal and the p-doped region is coupled to a second terminal;

a second diode including a second pn junction across a p-well and a second n-well adjacent to the p-well, wherein the p-well is coupled to the first terminal and the second n-well is coupled to the second terminal; and an isolation structure surrounding the semiconductor device, the isolation structure including a deep n-well interfacing with the second n-well, the deep n-well being spaced apart from the p-well and the first n-well.

22. The semiconductor device of claim 21, wherein the p-doped region is a first p-doped region, the semiconductor device further comprising:

a second p-doped region included within the p-well having a greater concentration of p-type dopants than the p-well; and a shallow trench isolation structure at least partially disposed within the p-well, the shallow trench isolation structure including a first portion interfacing with a first side of the second p-doped region and a second portion interfacing with a second side of the second p-doped region, the second side of the second p-doped region being opposite the first side of the second p-doped region.

23. The semiconductor device of claim 21, further comprising:

an n-doped region included within the first n-well having a greater concentration of n-type dopants than the first n-well; and a shallow trench isolation structure at least partially disposed within the first n-well, the shallow trench isolation structure extending from the n-doped region to the p-doped region.

24. The semiconductor device of claim 21, further comprising a p-type semiconductor layer; and wherein the first n-well, the p-well, and the deep n-well interface with the p-type semiconductor layer.

25. The semiconductor device of claim 24, further comprising an n-type buried layer; and wherein the deep n-well and the p-type semiconductor layer interface with the n-type buried layer.

26. The semiconductor device of claim 21, wherein the deep n-well extends under the second n-well without extending under the first n-well.

27. The semiconductor device of claim 21, wherein the deep n-well extends under the second n-well without extending under the p-well.

* * * * *